United States Patent [19]
Brock et al.

[11] Patent Number: 5,362,584
[45] Date of Patent: Nov. 8, 1994

[54] PHASE-SHIFTING TRANSPARENT LITHOGRAPHIC MASK FOR WRITING CONTIGUOUS STRUCTURES FROM NONCONTIGUOUS MASK AREAS

[75] Inventors: Phillip J. Brock, Sunnyvale; Jacqlynn A. Franklin, Milpitas; Franklin M. Schellenberg, Cupertino; Jiunn Tsay, San Jose, all of Calif.

[73] Assignee: International Business Machines Corporation, Armonk, N.Y.

[21] Appl. No.: 42,316

[22] Filed: Apr. 2, 1993

[51] Int. Cl.$^5$ .............................................. G03F 9/00
[52] U.S. Cl. ...................................... 430/5; 430/321; 430/322
[58] Field of Search ................... 430/5, 269, 321, 396, 430/322

[56] References Cited

U.S. PATENT DOCUMENTS

| | | | |
|---|---|---|---|
| 4,360,586 | 11/1982 | Flanders et al. | 430/321 |
| 4,631,416 | 12/1986 | Trutna, Jr. | 250/548 |
| 4,859,548 | 8/1989 | Heise et al. | 430/1 |
| 4,885,231 | 12/1989 | Chan | 430/321 |
| 4,902,899 | 2/1990 | Lin et al. | 250/492.1 |
| 5,273,850 | 12/1993 | Lee et al. | 430/5 |

OTHER PUBLICATIONS

Dainty et al., "Image Science, Principles, Analysis and Evaluation of Photographic-Type Imaging Processes", Academic Press, 1974.

Levenson et al., "Improving Resolution in Photolithography with a Phase-Shifting Mask", IEEE Transactions on Electron Devices, vol. Ed-29, No. 12, Dec. 1982.

Schellenberg et al., "Optimization of Real Phase Mask Performance", SPIE vol. 1604 11th Annual BACUS Symposium on Photomask Technology (1991).

Watanabe et al., "Sub-Quarter-Micron Gate Pattern Fabrication using a Tranparent Phase Shifting Mask", J. Vac. Sci. Technol. B 9(6), Nov./Dec. 1991.

Toh et al., "Chromless Phase-Shifted Masks: A New Approach to Phase-Shifting Masks", A Preprint from the Tenth Annual Symposium on Microlithography of BACUS, Sep. 1990.

Watanabe et al., "Pattern Tranfer Characteristics of Transparent Phase Shifting Mask", Japanese Journal of Applied Physics, vol. 30, No. 11B, Nov. 1991, pp. 3004–3009.

Watanabe et al., "Transparent Phase Shifting Mask", International Electron Devices Meeting, Dec. 9–12, 1990.

Brock et al., "Fabrication of Grooved Glass Substrates by Phase Mask Lithography", Reproduced from Research Disclosure, Jan. 1991, No. 321, Kenneth Mason Publications Ltd., England.

*Primary Examiner*—Steve Rosasco
*Attorney, Agent, or Firm*—Henry E. Otto, Jr.

[57] ABSTRACT

A plurality of noncontiguous polygonal regions of phase-shifting material have edges spaced apart less than the distance at which images of said edges would separate. The edges of the regions of phase-shifting material have differing arbitrarily selectable angular orientations (nonparallel as well as parallel) on a non-phase-shifting material. The noncontiguous phase-shifting regions may be arranged in a matrix of parallel columns and rows to facilitate fabrication and facilitate writing of the phase-shifting regions in any arbitrary pattern on an image plane. At least one of the phase-shifting regions constitutes a connective phase-shifting region with edges spaced from edges of adjacent ones of the phase-shifting regions to create a pattern with a continuous body of photoresist covering areas corresponding to the phase-shifting regions upon exposure of the mask. The phase-shifting regions may have different transmission coefficients to provide differing degrees of transparency or different degrees of phase shift to provide differing degrees of image intensity.

6 Claims, 3 Drawing Sheets

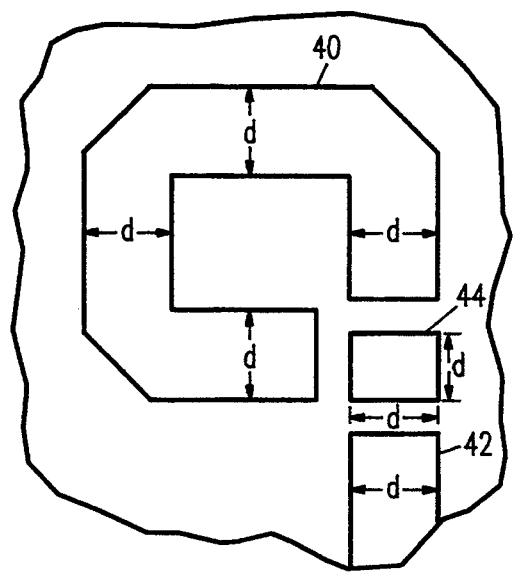
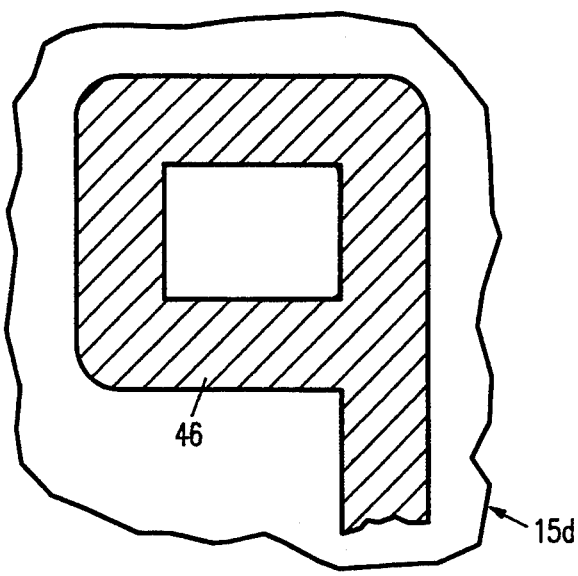
FIG. 4A　　　　　　　　FIG. 4B
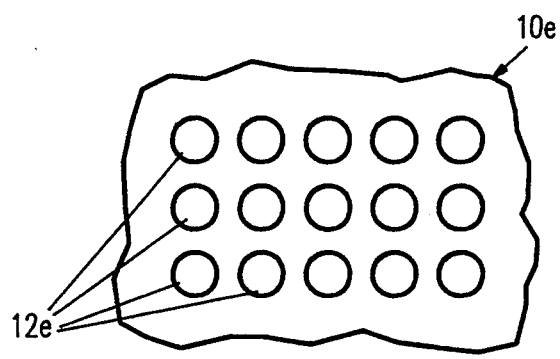
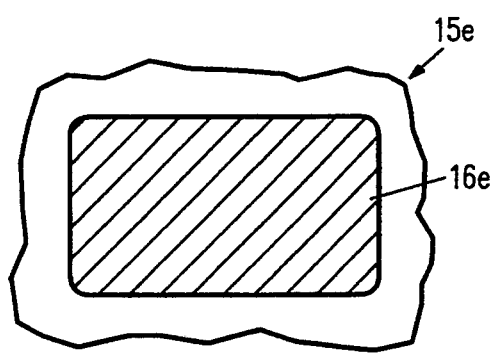
FIG. 5A　　　　　　　　FIG. 5B

PHASE-SHIFTING TRANSPARENT LITHOGRAPHIC MASK FOR WRITING CONTIGUOUS STRUCTURES FROM NONCONTIGUOUS MASK AREAS

FIELD OF THE INVENTION

This invention relates to phase-shifting lithographic masks with transparent portions providing regions of nonphase-shifting material covered in part by regions of phase-shifting material. It relates more particularly to such masks comprising a plurality of regions of noncontiguous phase-shifting material having edges spaced apart at differing arbitrarily selectable angular orientations at distances less than that at which images of said edges separate, thereby producing a corresponding arbitrary contiguous pattern upon exposure of a photoresist.

BACKGROUND OF THE INVENTION

Phase-shifting masks have recently been found to facilitate fabrication of new generations of integrated circuits and dynamic random access memories (DRAMs). In phase-shifting masks for exposing a photoresist pattern, phase-shift material delays the electromagnetic wave passing through the pattern so it arrives substantially 180° out of phase with the wave passing through the transparent apertured areas of a nonphase-shifting material. (As herein used, the term "nonphase-shifting material" connotes a material that introduces a constant phase shift, and the term "phase-shifting material" connotes one that introduces an additional phase shift due to a difference in thickness or refractive index gradient or a combination of both.) This creates destructive interference between the images of the nonphase-shifting regions and the phase-shifting regions which enhances the contrast of the overall image. It is known that the dark fringe from two closely-spaced parallel dark phase-shifted edges can be darker than the image of a single narrow opaque line and thus provides what has been termed a "darker-than-dark" mask.

The exact conditions under which the two edges merge depend upon the resist processes used for lithography, but generally occur for mask features with $k_1$ between 0.35 (when the fringe is barely dark enough to print) and 0.6 (when the two edges separate into two distinct dark lines). The width w of a feature as optically imaged is given by $$w = k_1 \frac{\lambda}{NA}$$

where NA represents the numerical aperture (typically 0.45 for modern i-line steppers) and $\lambda$ is the wavelength ($\lambda = 0.365\mu$n for i-line steppers).

Phase-shifting masks may or may not include a chrome layer. The present invention relates to an improved so-called transparent phase-shifting mask that preferably does not but may include any chrome or other material to create regions that print or project as dark areas.

The most pertinent prior art known to applicants is:

[A] Toh et al., "Chromeless Phase-shifted Masks: A New Approach to Phase-shifting Masks", presented at the Tenth Annual Symposium on Microlithography of BACUS, September 1990.

[B] Watanabe et al., "Sub-quarter-micron Gate Pattern Fabrication Using a Transparent Phase Shifting Mask", published by the Journal of Vacuum Science Technology, Vol. B9, No. 6, November/December 1991, pp. 3172–3175.

Reference [A] describes transparent (i.e., chromeless) phase-shifting lithographic masks that write patterns of contiguous structures from closely-spaced regions of phase-shifting material covering selected areas of a transparent nonphase-shifting material. One embodiment (at the top of FIG. 13) is a mask with two integral orthogonally arranged phase-shifting regions that form a right-angle elbow; but (as shown at the bottom of FIG. 13) the image intensity is nonuniform because the diagonal distance between the inner and outer edges at the junction of the elbow is greater than that between the parallel edges of the straight sections of the elbow. If the diagonal distance is great enough, the images of the phase-shifting regions will not merge at the junction and the bright spot thus created will cause an undesired removal of photoresist at the junction. Another embodiment (shown in FIGS. 14 and 15) depicts a mask layout pattern consisting of a "checkerboard" arrangement of phase-shifting and nonphase-shifting regions in which the phase-shifting regions have contiguous corner contact with those in adjacent rows and columns.

Reference [B] discloses (in FIG. 5) a plurality of spaced parallel regions of phase-shifting material.

Neither of these references teaches nor remotely suggests providing noncontiguous regions of phase-shifting material having respective phase-shifting edges spaced apart at arbitrarily selectable differing angular orientations to provide transparent lithographic masks and methods of fabricating same which (1) can provide images with wider line widths than those presently known to applicants; and which, in addition, (2) can provide improved depth of focus and/or more latitude in times and intensities in the exposure processing window; (3) enable the mask for certain applications to be written with only one exposure; and (4) enable optical inspection techniques without requiring subresolution to check integrity of the masks in a single electron beam write operation.

SUMMARY OF THE INVENTION

Toward this end and according to the invention, a plurality of noncontiguous polygonal regions of phase-shifting material are provided, each region having widths defined by edges spaced apart less than the minimum distance at which images of said edges would print as separate. At least one of the phase-shifting regions constitutes a connective phase-shifting region with edges spaced from edges of adjacent ones of the phase-shifting regions by distances less than said minimum distance to create a pattern with a continuous body of photoresist covering areas corresponding to the phase-shifting regions upon exposure of the mask. The phase-shifting regions have differing arbitrarily selectable angular orientations (nonparallel as well as parallel) on a nonphase-shifting material.

The noncontiguous phase-shifting regions may be arranged in a matrix of parallel columns and rows to facilitate fabrication and facilitate writing of the phase-shifting regions in any arbitrary pattern on an image plane.

The phase-shifting regions may have different transmission coefficients to provide differing degrees of transparency or different degrees of phase shift to provide differing degrees of image intensity. Variations in transparency are achieved by providing a substrate comprising quartz and chrome or another opaque material having differing thicknesses.

BRIEF DESCRIPTION OF THE DRAWINGS

FIGS. 3A and 4A depict transparent masks with different mask patterns, according to still other embodiments of the invention; and FIGS. 3B and 4B depict the images provided by the respective patterns when exposed.

FIG. 5A depicts a transparent mask with a grid pattern of phase-shifting regions, according to another embodiment of the invention; and FIG. 5B depicts the image provided by the mask of FIG. 5A when exposed.

DESCRIPTION OF THE PREFERRED EMBODIMENTS

Each of the masks 10 hereinafter described embodying the invention consists only of phase-shifting regions 12 etched in selected patterns in a transparent nonphase-shifting material 14, such as quartz.

Figure 1A:
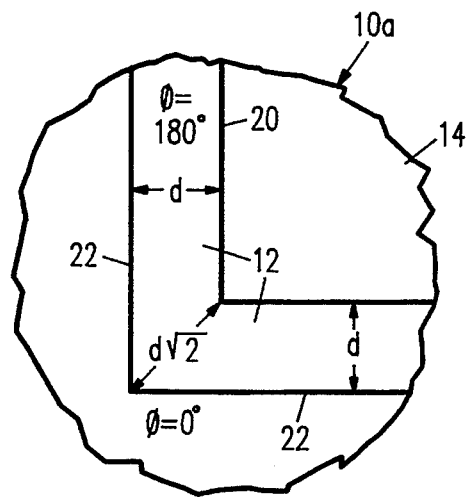
FIG. 1A depicts a prior art transparent mask with two closely-spaced sets of parallel edges for providing a dark "L" or elbow-configured image.
Figure 1B:
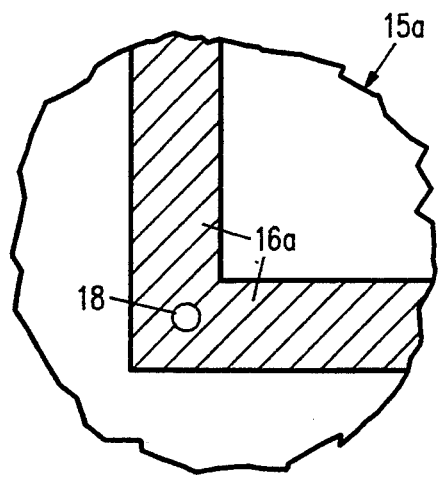
FIG. 1B depicts the image, including a bright spot, which may result when the mask is exposed.

FIG. 1A depicts a prior art mask 10a having an "L"-shaped mask pattern comprising two pairs of parallel lines that intersect at right angles. This pattern is intended to provide on a substrate 15a a completely dark L-shaped image 16a when exposed, but, as illustrated in FIG. 1B, is flawed with a bright spot 18. This bright spot can result from the fact that while the distance d between the parallel edges (i.e., the width) of each leg 20, 22 of phase-shifting material is small enough to ensure that the image in both legs of the L will be written completely dark without blemish, the diagonal distance at the junction of the orthogonally arranged, interconnected legs 20, 22 is actually as much as $d\sqrt{2}$. This may be enough to exceed a minimum distance d min at which edge separation takes place, noting that d min will vary depending upon the lithography exposure tool used and the exposure characteristics of the photoresist. The obvious solution would be to reduce the distance d so that the distance $d\sqrt{2}$ would be within the aforesaid minimum distance d min. However, this will undesirably reduce the maximum printable line width achievable.

Figure 2A:
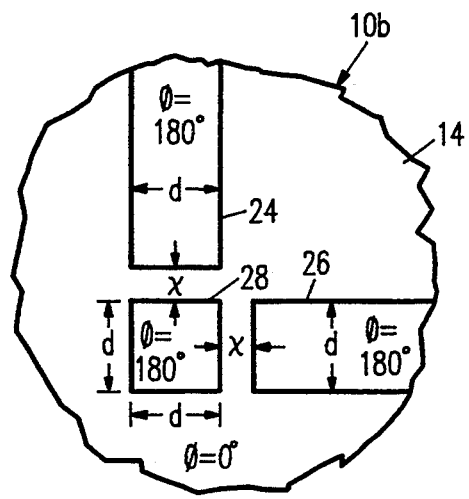
FIG. 2A depicts a transparent mask according to one embodiment of the invention for providing, as depicted in FIG. 2B, a completely dark "L" or elbow-configured image without bright spots when the mask is exposed.

Applicants discovered that, according to the invention, use of a mask 10b with a pattern like that shown in FIG. 2A will provide on substrate 15b an L-shaped image 16b with opposed edges the same distance d apart as those in FIG. 1A but would not produce a bright spot. This is achieved by using two noncontiguous, orthogonally positioned, three-dimensional legs 24, 26 of phase-shifting material, each having a width d defined by parallel edges distance d apart. These legs do not meet, but are separated at the "junction" by a gap in which an additional phase-shifting region 28 is positioned. As illustrated, region 28 has a width d and length d and edges which are spaced apart a distance x from adjacent transverse edges that constitute the ends of legs 24, 26. Distance d and distance x do not exceed the aforesaid minimum distance d min. Since this configuration permits printing of a completely dark L-shaped feature with legs distance d apart without blemish, wider circuit lines can be printed by transparent phase-shifting masks embodying the invention than heretofore possible.

Expanding this discovery, applicants found that masks could be fabricated with many useful patterns by employing connective phase-shifting regions having edges spaced apart from, and interposed at a junction between, adjacent edges of other phase-shifting regions.

Figure 3A:
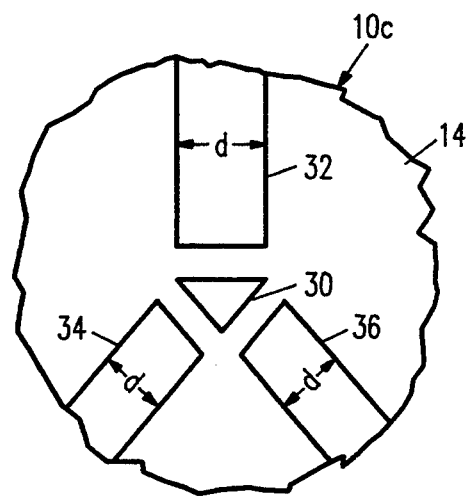
Figure 3B:
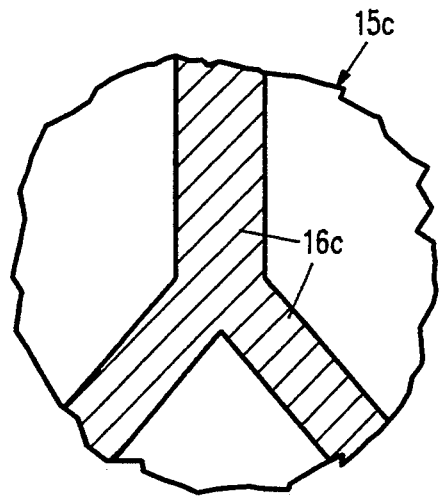

For example, as illustrated in FIGS. 3A and 3B, connective phase-shifting region 30 has edges spaced no more than distance d min apart from facing edges of phase-shifting regions 32, 34, 36. As illustrated, these regions 32, 34, 36 each comprise pairs of parallel edges spaced apart a distance d, which does not exceed distance d min. Regions 32, 34, 36 are arranged in a generally Y-shaped configuration to produce a Y-shaped image 16c when exposed. It will be understood, however, that the mask pattern may be formed of a plurality of phase-shifting regions having a variety of arbitrarily selectable included angles; for example, to produce a T-shaped image. The only requirement is that each edge of connective region 30 be no more than said distance d min from a facing edge of an associated region 32, 34, 36, and that the width of each region not exceed distance d min.

Another configuration is illustrated in FIG. 4A, where the mask pattern includes phase-shifting regions 40, 42 and a connective region 44, each having widths d not exceeding distance d min. Regions 40, 42 have transverse edges separated no more than distance d min from facing transverse edges of connective region 44. When exposed, this mask will produce on substrate 15d an image 46 as shown in FIG. 4B.

Figure 2B:
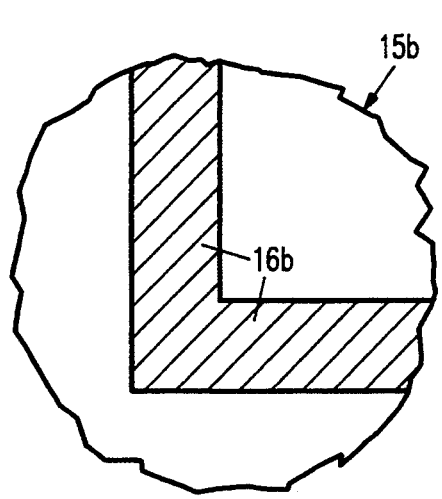

The configurations illustrated in FIGS. 2, 3, and 4 provide, for a fixed partially coherent light source, an improved depth of focus because the range of focus settings over which destructive interference can occur is greater than the range within which a conventional chrome-on-glass lithographic mask is in focus. Thus, large junctions with wider line widths can be fabricated with more latitude in times and intensities in the exposure processing window.

As illustrated in FIG. 5A, according to another embodiment of the invention, mask 10e has a plurality of phase-shifting regions 12e arranged in a grid-like or matrix arrangement of columns and rows. Regions 12e have circumferential edges spaced apart from circumferential edges of respective adjacent regions 12e by distances less than the minimum distance d min. As a result, and as depicted in FIG. 5B, the mask pattern will print on substrate 15e a single, substantially rectangular, completely dark image 16e.

In practice, mask 10e was fabricated from a layout of hollow 0.75 micron squares arranged in a matrix pattern and having a pitch of 1.75 microns; i.e., with a space of 0.25 microns between the edges of adjacent squares. These squares etched into the circular phase-shifting regions 12e are approximately 1.2 microns in diameter. This mask was subsequently printed on a Nikon NSR tool with a five-times reduction. The pattern on mask 10e printed as opaque for exposures up to eight times the normal exposure dose needed to clear photoresist on silicon wafers, indicating that the mask pattern was highly efficient. Micrographs of the exposed silicon wafers demonstrated this insensitivity to overexposure. The mask printed as opaque for several microns of defocus as well.

According to a feature of the invention, mask 10e with its matrix arrangement of noncontiguous phase-shifting regions 12e is easier to fabricate than one having a checkerboard arrangement of contiguous phase-shifting regions. Also, the mask 10e may be patterned in any desired configuration, in much the same manner as a monitor screen consisting of a dense matrix of picture elements or "pels".

Figure 6A:
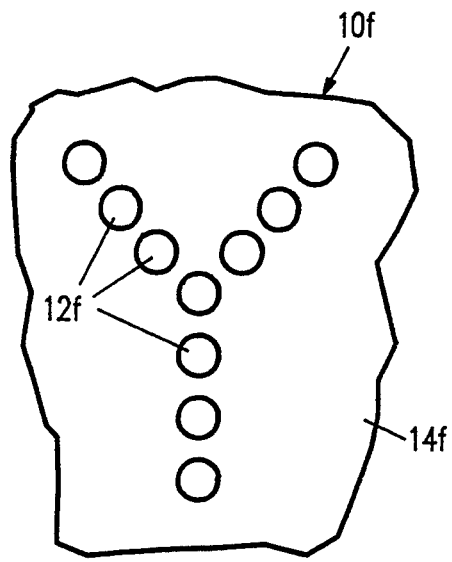
FIGS. 6A and 7A depict other transparent masks generated from grid patterns of phase-shifting regions.
Figure 6B:
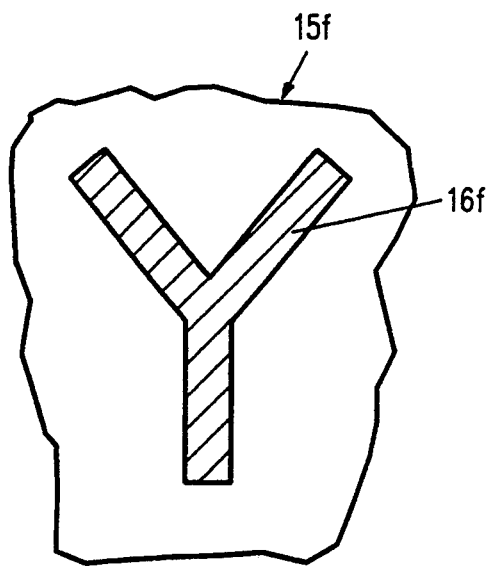
FIGS. 6B and 7B depict the images provided by the masks of FIGS. 6A and 7A, respectively.
Figure 7A:
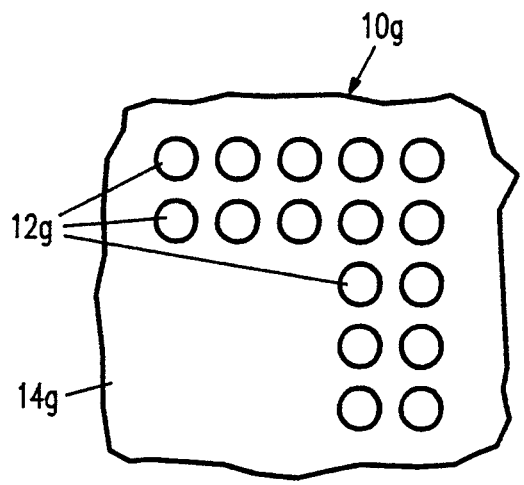
Figure 7B:
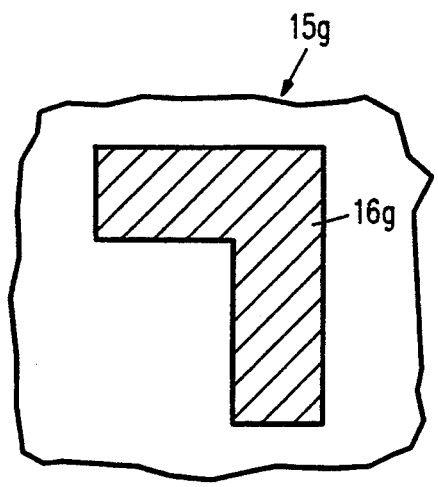

By using noncontiguous phase-shifting regions etched in selectable rows and columns, it is possible to readily generate mask patterns with any desired configuration. For example, the pattern on mask 10f of noncontiguous phase-shifting regions 12f illustrated in FIG. 6A will produce on a substrate 15f the image 16f shown in FIG. 6B. The pattern on mask 10g of noncontiguous phase regions 12g illustrated in FIG. 7A will produce on substrate 15g the image 16g shown in FIG. 7B. In each case, the respective regions 12f and 12g will be separated from each other by distances not exceeding the minimum distance d min for the lithography exposure tool used and exposure characteristics of the photoresist.

An important consideration in the design of chromeless phase-shifting masks is to utilize fabrication processes which can be easily reproduced. A key step in such a process is etching the mask substrate material to generate topography which results in the desired phase-shifted regions. While dry etch processes (reactive ion etching, or RIE) seem initially attractive, such processes are difficult to control to provide uniform etch rates (<5% etch depth variation) over the large areas required to fabricate a 5×5-inch mask substrate. RIE processes also tend to produce roughness in topography in the bottoms of the etched areas. Applicants have found that a wet etch process has the advantage of providing a smooth (at the 5–10⅛ level) topography in the etched areas.

More specifically, the following steps were followed to fabricate applicants' transparent phase-shifting masks. A desired pattern was written on a chrome-quartz substrate by electron-beam lithography or laser lithography. Then the clean chrome-patterned mask was immersed in a solution of a commercial 5:1 buffered hydrofluoric acid (mole ratio of saturated aqueous ammonium bifluoride/hydrofluoric acid) "silicon oxide etchant" maintained at a temperature of 17–20° C. Since the etch rate is strongly dependent on temperature, the etch time had to be adjusted for each experiment if the etchant temperature was not controlled to ±0.2° C. for each etch run. Once etched for the appropriate length of time (by empirically correlating the etch rate for the feature size being etched with the desired etch depth), the mask substrate was removed from the etch solution and immediately rinsed with deionized water for at least five minutes to remove all traces of etchant. In practice, an etch time of 170 seconds was required to achieve an etch depth of 3460Å. The chrome was then stripped from the mask to provide the desired phase-shifting pattern on the quartz substrate. With edge depths of 2500–4000521 and a feature size $\geq 0.4\mu m$, this etch process provided masks having significant anisotropic characteristics. The etched walls were surprisingly and desirably found to produce rounded corners and to be somewhat more vertical than would be expected with a totally isotropic etch process.

Applicants' transparent phase-shifting masks may thus be written with only one exposure. However, if phase-shifting regions with different transmission coefficients are desired to provide differing degrees of transparency, a separate exposure step will be required for each different transmission coefficient. Variations in transparency are achieved by providing a substrate comprising quartz and chrome or another opaque material having differing chrome thicknesses.

Also, by providing phase-shifting regions with different degrees of phase shift, differing image intensities can be achieved.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A lithographic mask for exposing a photoresist, said mask comprising a transparent portion providing a nonphase-shifting region covered in part by a plurality of noncontiguous phase-shifting regions in the form of substantially equally-spaced hollow circles arranged in a matrix of parallel columns and rows to facilitate fabrication and facilitate writing of said phase-shifting regions in any arbitrary pattern on an image plane, each of said hollow circles having circumferential edges spaced from each other by distances, as determined by the exposure characteristics of the photoresist, less than that at which images of said edges separate.

2. The mask of claim 1, wherein at least two of the phase-shifting regions have different transmission coefficients to provide differing degrees of transparency.

3. The mask of claim 1, wherein at least two of the phase-shifting regions have different degrees of phase shift to provide differing image intensities.

4. The mask of claim 1, wherein at least two of the phase-shifting regions have different transmission coefficients and degrees of phase shift.

5. The mask of claim 1, wherein said distances are determined at least in part by the thickness and refractive index of the photoresist.

6. The mask of claim 1, wherein the phase-shifting regions provide a phase shift of substantially 180 degrees relative to the nonphase-shifting region.

* * * * *